(12) United States Patent
Honma et al.

(10) Patent No.: US 11,492,702 B2
(45) Date of Patent: Nov. 8, 2022

(54) FILM-FORMING APPARATUS AND FILM-FORMING METHOD

(71) Applicant: TOKYO ELECTRON LIMITED, Tokyo (JP)

(72) Inventors: Manabu Honma, Oshu (JP); Yuka Nakasato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 445 days.

(21) Appl. No.: 16/171,522

(22) Filed: Oct. 26, 2018

(65) Prior Publication Data

US 2019/0136377 A1 May 9, 2019

(30) Foreign Application Priority Data

Nov. 6, 2017 (JP) .............................. JP2017-214122

(51) Int. Cl.
*C23C 16/455* (2006.01)
*H01L 21/02* (2006.01)
*C23C 16/52* (2006.01)
*C23C 16/34* (2006.01)
(Continued)

(52) U.S. Cl.
CPC .......... *C23C 16/45527* (2013.01); *B05C 9/08* (2013.01); *B05C 9/12* (2013.01); *C23C 16/345* (2013.01); *C23C 16/45502* (2013.01); *C23C 16/45534* (2013.01); *C23C 16/45544* (2013.01); *C23C 16/45551* (2013.01); *C23C 16/45553* (2013.01); *C23C 16/45578* (2013.01); *C23C 16/52* (2013.01); *H01L 21/0217* (2013.01);
(Continued)

(58) Field of Classification Search
CPC ......................... C23C 16/52; C23C 16/45527
See application file for complete search history.

(56) References Cited

U.S. PATENT DOCUMENTS

2006/0124169 A1* 6/2006 Mizusawa ......... H01J 37/32449
137/7
2010/0229797 A1* 9/2010 Kato ................. H01L 21/68764
118/730
2015/0275371 A1* 10/2015 Mizuta .................... C23C 16/52
118/697

FOREIGN PATENT DOCUMENTS

JP    2010-192657 A    9/2010
JP    2010-212627 A    9/2010
JP    2010-219125 A    9/2010
(Continued)

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

An apparatus for forming a thin film by repeating, plural times, a cycle including supplying and adsorbing a precursor gas onto a substrate and generating a reaction product by allowing the precursor gas on the substrate to react with a reaction gas, which includes: a main precursor gas supply part for supplying the precursor gas; a reaction gas supply part for supplying the reaction gas; an adjustment-purpose precursor gas supply part for supplying an adjustment-purpose precursor gas to adjust an in-plane film thickness distribution of the thin film; and a controller for outputting a control signal to execute a step of forming the thin film using the main precursor gas supply part and the reaction gas supply part, and subsequently a step of supplying the adjustment-purpose precursor gas from the adjustment-purpose precursor gas supply part to compensate for a film thickness of a portion having a relatively thin film thickness.

10 Claims, 13 Drawing Sheets

(51) Int. Cl.
  *B05C 9/08* (2006.01)
  *B05C 9/12* (2006.01)
(52) U.S. Cl.
  CPC .... *H01L 21/0228* (2013.01); *H01L 21/02211* (2013.01); *H01L 21/02274* (2013.01)

(56) References Cited

FOREIGN PATENT DOCUMENTS

| | | |
|---|---|---|
| JP | 2016-046415 A | 4/2016 |
| JP | 2016-092026 A | 5/2016 |
| JP | 2017117943 A | 6/2017 |
| KR | 10-2010-0103416 A | 9/2010 |
| KR | 10-2016-0052336 A | 5/2016 |

\* cited by examiner

| Encoder value | Central side valve | Peripheral side valve | MFC flow rate |
|---|---|---|---|
| ⋮ | ⋮ | ⋮ | ⋮ |
| ~$n_1$ | Closed | Closed | Constant |
| $n_1$~$n_2$ | Opened | Closed | Constant |
| $n_2$~$n_3$ | Closed | Closed | Constant |
| $n_3$~$n_4$ | Opened | Closed | Constant |
| $n_4$~ | Closed | Closed | Constant |
| ⋮ | ⋮ | ⋮ | ⋮ |

FILM-FORMING APPARATUS AND FILM-FORMING METHOD

CROSS-REFERENCE TO RELATED APPLICATION

This application is based upon and claims the benefit of priority from Japanese Patent Application No. 2017-214122, filed on Nov. 6, 2017, the entire contents of which are incorporated herein by reference.

TECHNICAL FIELD

The present disclosure relates to a technique for stacking reaction products on a surface of a substrate by supplying process gases that react with each other onto the substrate.

BACKGROUND

As one of the methods for forming a thin film such as a silicon nitride film on a semiconductor wafer (hereinafter referred to as a "wafer") which is a substrate, an atomic layer deposition (ALD) method of stacking reaction products on a surface of a wafer by sequentially supplying a precursor gas and a reaction gas onto the surface of the wafer is known. As a film-forming apparatus for performing a film-forming process using such an ALD method, for example, an apparatus in which a rotary table for revolving a plurality of wafers arranged in a circumferential direction is installed inside a vacuum container is known. In such a film-forming apparatus, a precursor gas supply region and a reaction gas supply region are formed so as to be spaced apart from each other in a rotational direction of the rotary table. The wafers pass through the precursor gas supply region and the reaction gas supply region in an alternate manner, thus forming films on the respective wafers.

Such a rotational film-forming apparatus has a tendency to degrade a film thickness distribution uniformity of the wafer in a revolution direction. For example, assuming that a wafer is divided into two regions in a line along the diameter of a circle which is a revolution orbit, a region where the film thickness is thinner than that of the other region appears at left and right sides of the line at the center of the circle.

One of the factors may be that, since a wafer mounting region is formed as a recess, a gas is introduced between the peripheral edge of the wafer and the inner peripheral wall of the recess and the influence of this gas differs in the circumferential direction of the wafer. In addition, even when the wafer W is placed on a flat surface without forming a recess, it is presumed that the same phenomenon occurs because a gas flow is disturbed near the peripheral end face of the wafer. Another factor may be the influence of plasma distribution based on the shape of an antenna and the like.

Although the film thickness of the relevant region is thinner than the film thickness of other regions, a film thickness difference is about several Å, which is not a phenomenon affecting a yield. However, since miniaturization of pattern line width and three-dimensionalization of devices are progressing, there is a possibility that this phenomenon may become more apparent.

In addition, in a film-forming apparatus for forming a film by supplying a precursor gas and a reaction gas onto a revolving substrate, there has been proposed a technique for forming regions having an uniform concentration of a plasmarized reaction gas by setting an angle formed by a gas injector to be less than 180 degrees, thereby uniformizing the film thickness. However, with respect to the uniformity of plasma and a method of supplying a gas, it is difficult to cope with a slight difference in film thickness, which is caused by the structure of a film-forming apparatus, requiring further improvement.

SUMMARY

Some embodiments of the present disclosure provide a technique capable of providing high in-plane uniformity in film thickness when stacking reaction products on the surface of a substrate by supplying process gases that react with each other onto the substrate.

According to one embodiment of the present disclosure, there is provided a film-forming apparatus for forming a thin film by repeating a cycle a plurality of times, the cycle including supplying and adsorbing a precursor gas onto a substrate mounted on a mounting part inside a vacuum container and subsequently generating a reaction product by allowing the precursor gas absorbed onto the substrate to react with a reaction gas, the film-forming apparatus including: a main precursor gas supply part configured to supply the precursor gas; a reaction gas supply part configured to supply the reaction gas; at least one adjustment-purpose precursor gas supply part configured to supply an adjustment-purpose precursor gas to adjust an in-plane film thickness distribution of the thin film; and a controller configured to output a control signal so as to execute a step of forming the thin film on the substrate using the main precursor gas supply part and the reaction gas supply part, and subsequently a step of supplying the adjustment-purpose precursor gas from the at least one adjustment-purpose precursor gas supply part to compensate for a film thickness of a portion having a relatively thin film thickness as compared to other portions in the thin film.

According to another embodiment of the present disclosure, there is provided a method of forming a thin film using a film-forming apparatus for forming a film by repeating a cycle a plurality of times, the cycle including supplying and adsorbing a precursor gas from a main precursor gas supply part onto a substrate mounted on a mounting part inside a vacuum container, supplying a reaction gas from a reaction gas supply part, and allowing the precursor gas absorbed on the substrate to react with the reaction gas to produce a reaction product, the method including: forming a thin film on the substrate using the main precursor gas supply part and the reaction gas supply part; and subsequently, supplying an adjustment-purpose precursor gas from an adjustment-purpose precursor gas supply part to compensate for a film thickness of a portion having a relatively thin film thickness as compared to other portions in the thin film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
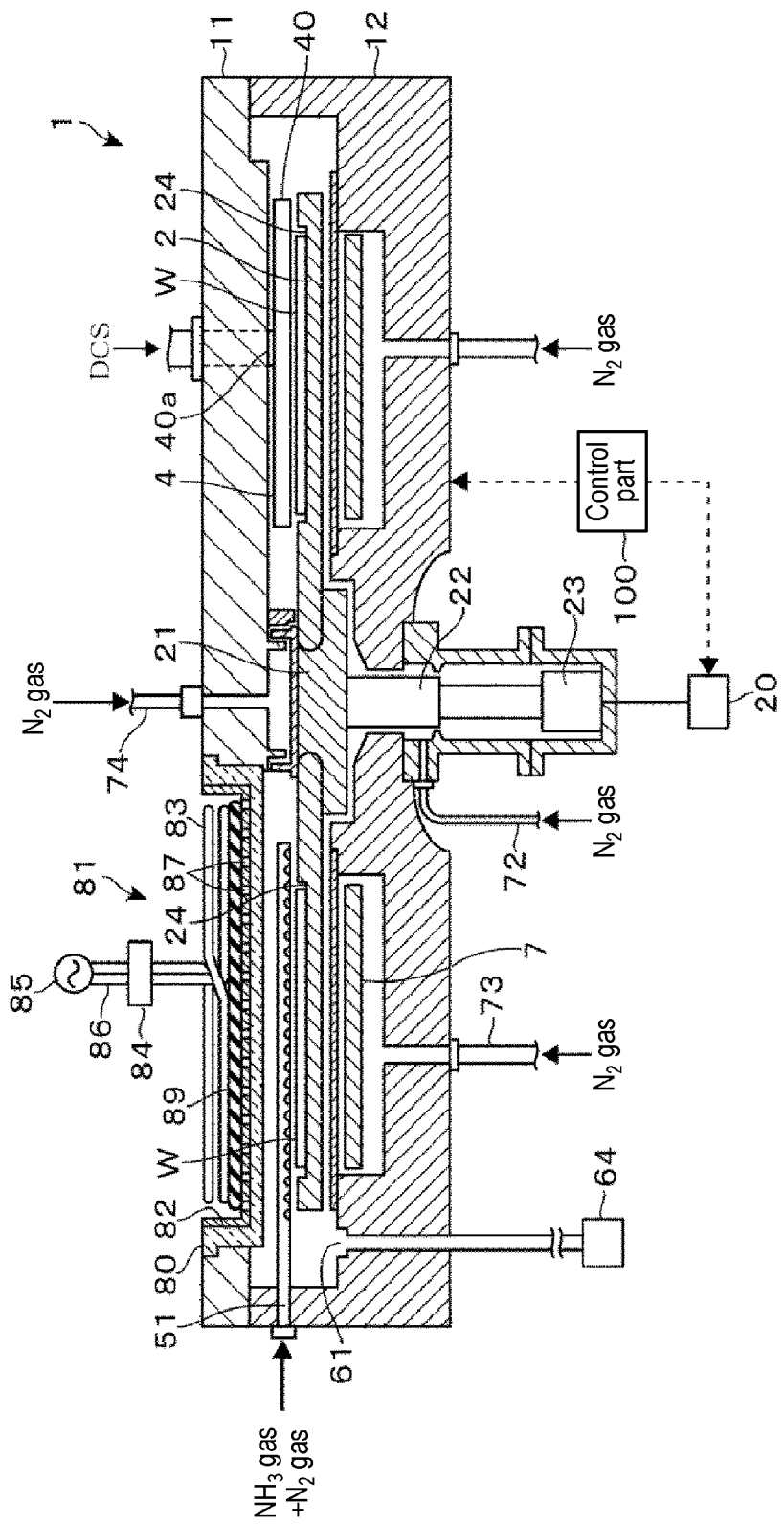
FIG. 1 is a longitudinal sectional view of a film-forming apparatus according to a first embodiment.
Figure 2:
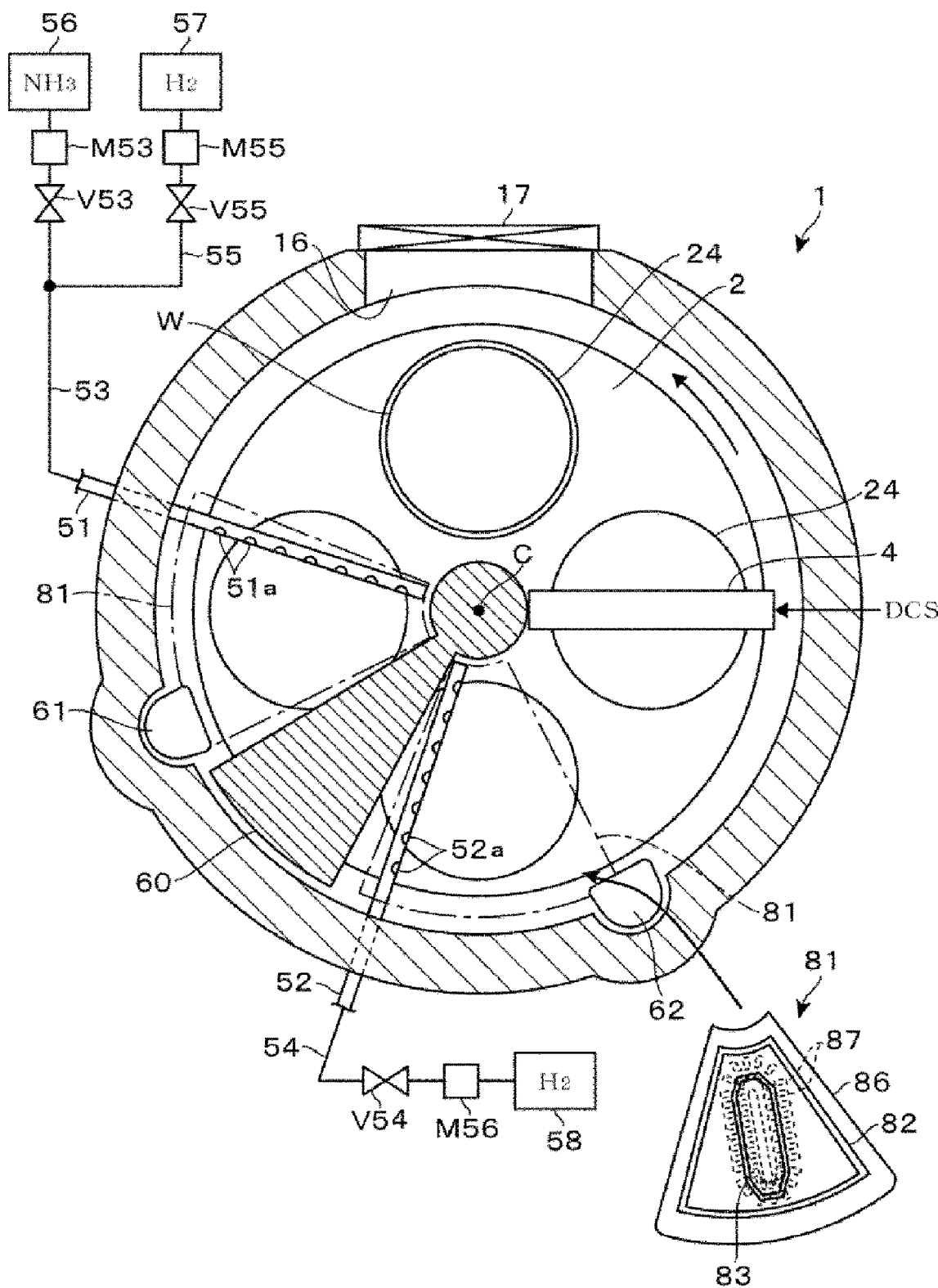
FIG. 2 is a plan view of the film-forming apparatus.

A film-forming apparatus according to a first embodiment will be described. As shown in FIGS. 1 and 2, the film-forming apparatus includes a vacuum container 1 having a substantially-circular planar shape, and a rotary table 2 which is installed inside the vacuum container 1 to revolve a wafer W. A rotational center C of the rotary table 2 coincides with the center of the vacuum container 1. The rotary table 2 is made of, for example, quartz. The vacuum container 1 includes a top plate portion 11 and a container body 12. The top plate portion 11 is configured to be attachable to and detachable from the container body 12. A separation gas supply pipe 74 for supplying a nitrogen ($N_2$) gas as a separation gas is connected to the central portion of an upper surface of the top plate portion 11. This prevents different process gases from mixing with each other at the central portion inside the vacuum container 1, The rotary table 2 is fixed to a substantially cylindrical core portion 21 at the central portion of the rotary table 2. The rotary table 2 is configured to be rotatable around a vertical axis, in this example, counterclockwise when viewed from above, with the rotational center C in FIG. 2 as a center, by a rotary shaft 22 which is connected to a lower surface of the core portion 21 and extends in the vertical direction. Reference numeral 23 in FIG. 1 denotes a rotation mechanism for rotating the rotary shaft 22 around the vertical axis. Further, an encoder 20 is connected to the rotation mechanism 23 and is configured to transmit an encoder value indicating a rotational angle of the rotary table 2 to a control part 100 to be described later. A $N_2$ gas as a purge gas is supplied from a purge gas supply pipe 72 to the periphery of the rotary shaft 22 and the rotation mechanism 23.

In an upper surface of the rotary table 2 are formed four circular recesses 24 in which the wafers W are accommodated respectively, along the circumferential direction (rotational direction) of the rotary table 2. Further, a heater 7, which is a temperature adjustment part for adjusting a temperature of the rotary table 2 to heat the wafers W mounted on the rotary table 2 to, for example, 450 degrees C., is concentrically installed at the bottom portion of the vacuum container 1. Reference numeral 73 in FIG. 1 denotes a purge gas supply pipe for supplying a $N_2$ gas as a purge gas to a region where the heater 7 is installed.

As shown in FIG. 2, a transfer port 16 through which a wafer W is transferred is formed in the side wall of the vacuum container 1. The transfer port 16 is opened and closed by a gate valve 17. Three lift pins (not shown) for pushing up the wafer W mounted on the rotary table 2 from below are arranged below the rotary table 2 at equal intervals in the circumferential direction of the wafer W in a region facing the transfer port 16 inside the vacuum container 1. Holes are formed in the bottom of each of the recesses 24 so as to correspond to the three lift pins. When loading and unloading the wafer W, the rotary table 2 sequentially stops at a position where the holes of the recess 24 and the lift pins face each other in the vertical direction. The wafer W is delivered between the outside of the vacuum container 1 and the interior of the recess 24 via the transfer port 16 in cooperation between a substrate transfer mechanism (not shown) installed outside the film-forming apparatus and the lift pins.

As shown in FIG. 2, assuming that the rotational direction (counterclockwise direction in this example) of the rotary table 2 is a forward side and a direction (clockwise direction in this example) opposite to the rotational direction is a backward side, a gas supply/exhaust unit 4 for supplying a dichlorosilane (DCS) gas as a precursor gas toward the wafer W revolving by the rotary table 2, a reaction gas nozzle 51 for supplying a mixture of an $NH_3$ gas as a reaction gas and a $H_2$ gas toward the revolving wafer W, and a modifying gas nozzle 52 for supplying a $H_2$ gas as a modifying gas toward the revolving wafer W are installed above the rotary table 2 in that order along the rotational direction toward the forward side. In the following description, a rotational direction of the wafer W is referred to as a forward side of the wafer W and a direction opposite to the rotational direction of the wafer W is referred to as a backward side of the wafer W. In this example, the gas supply/exhaust unit 4 is used as both a main precursor gas supply part and an adjustment-purpose precursor gas supply part. The reaction gas nozzle 51 corresponds to a reaction gas supply part.

Figure 3:
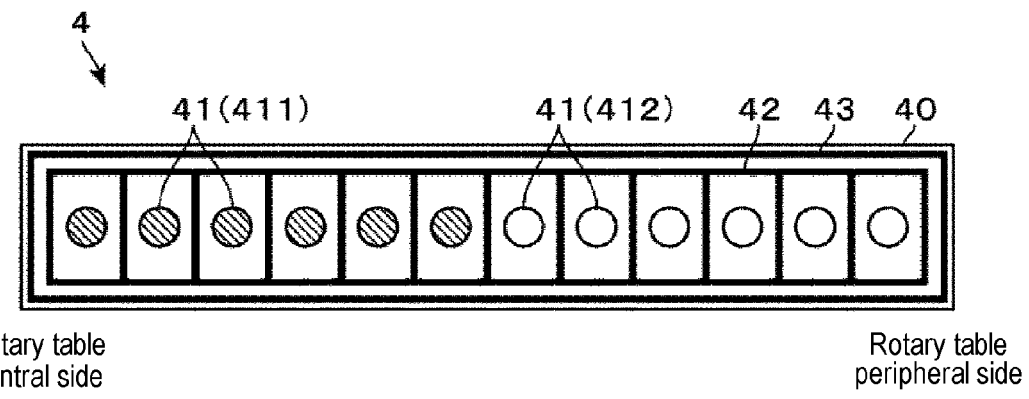
FIG. 3 is a bottom-side plan view of a gas supply/exhaust unit.
Figure 4:
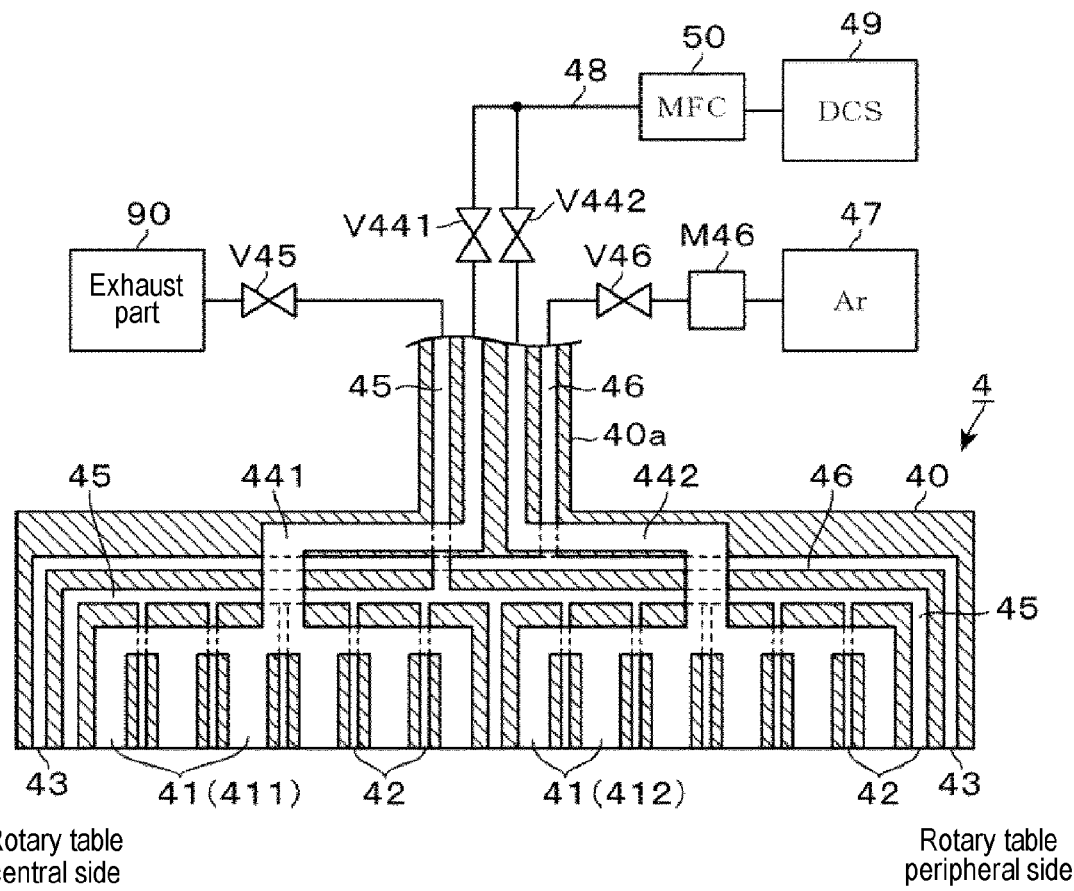
FIG. 4 is a cross-sectional view of the gas supply/exhaust unit.

The gas supply/exhaust unit 4 will be described with reference to FIG. 3 which is a bottom view and FIG. 4 which is a longitudinal sectional side view. The gas supply/exhaust unit 4 includes a prismatic main body 40 provided so as to extend from a peripheral edge side of the rotary table 2 toward a central side thereof. As shown in FIG. 1, the gas supply/exhaust unit 4 is fixed to the lower surface of the top plate portion 11 by a support portion 40a formed on an upper surface of the main body 40. As shown in FIGS. 3 and 4, DCS gas discharge ports 41 for supplying a DCS gas, slit-like exhaust ports 42 formed in a lattice shape to surround the DCS gas discharge ports 41, and a separation gas discharge port 43 for discharging a separation gas such as argon (Ar) gas or the like, which is formed around the exhaust ports 42, are formed in the lower surface of the main body 40. In FIG. 3, the exhaust ports 42 and the separation gas discharge port 43 are shown in thick lines.

The DCS gas discharge ports 41 are formed at equal intervals in the longitudinal direction of the main body 40 over a range traversing a passage region through which the wafer W passes. Of the DCS gas discharge ports 41, DCS gas discharge ports 41 for discharging the DCS gas toward a region of the central side of the rotary table 2 are referred to as central-side gas discharge ports 411, and DCS gas discharge ports 41 for discharging the DCS gas toward a region of the peripheral side of the rotary table 2 are referred to as peripheral-side gas discharge ports 412. In FIG. 3, the central-side gas discharge ports 411 are shown by hatching.

As shown in FIG. 4, the central-side gas discharge ports 411 and the peripheral-side gas discharge ports 412 are respectively connected to one ends of a central-side gas supply passage 441 and a peripheral-side gas supply passage 442, which are configured to supply gases independently of each other. Each of the other ends of the central gas supply passage 441 and the peripheral gas supply passage 442 circulate through the interiors of the main body 40 and the support portion 40*a*, penetrate the top plate portion 11 in the thickness direction to be drawn outside the vacuum container 1, and is connected to one end of a DCS gas supply pipe 48. A DCS gas supply source 49 is connected to the other end of the DCS gas supply pipe 48. A central-side valve V441 and a peripheral-side valve V442 are respectively installed in the central-side gas supply passage 441 and the peripheral-side gas supply passage 442. A mass flow controller (MFC) 50 is installed in the DCS gas supply pipe 48. Further, a flow rate adjustment part (not shown) is installed in each of the central-side gas supply path 441 and the peripheral-side gas supply path 442. The flow rate adjustment part adjusts a flow rate of the DCS gas discharged from the peripheral-side gas discharge ports 412 to be larger than that of the DCS gas discharged from the central-side gas discharge ports 411, when opening both the central-side valve V441 and the peripheral-side valve V442 to supply the DCS gas.

By opening and closing the central-side valve V441 and the peripheral-side valve V442, respectively, the supply of gases from the central-side gas discharge ports 411 and the peripheral-side gas discharge ports 412 is switched on and off. Further, the flow rates of the DCS gas supplied from the central-side gas discharge ports 411 and the peripheral-side gas discharge ports 412 are set by adjusting the flow rate of the DCS gas with the mass flow controller (MFC) 50. Therefore, the central-side valve V441, the peripheral-side valve V442 and the MFC 50 correspond to a flow rate adjustment part.

The exhaust ports 42 are connected to an exhaust flow path 45 which is formed independently from the central-side gas supply path 441 and the peripheral-side gas supply path 442 inside the main body 40. The DCS gas or the separation gas supplied to the lower surface side of the gas supply/exhaust unit 4 flows into one end side of the exhaust flow path 45 via the exhaust ports 42. Further, the exhaust flow path 45 is formed so as to penetrate the interior of the support portion 40*a* and the top plate portion 11. An exhaust part 90 is connected to the other end side of the exhaust flow path 45. In FIG. 4, reference numeral V45 denotes a valve for switching an ON-OFF operation of the exhaust.

As shown in FIG. 4, the separation gas discharge port 43 is connected to one end of a separation gas flow path 46 formed independently from the central-side gas supply passage 441, the peripheral-side gas supply passage 442 and the exhaust flow path 45. The other end of the separation gas flow path 46 penetrates the interiors of the support portion 40*a* and the top plate portion 11 and is coupled to a separation gas supply source 47 via a valve V46 and a flow rate adjustment part M46.

Accordingly, when exhausting the DCS gas and the separation gas from the exhaust ports 42 while discharging the gases, a region surrounded by a curtain of an air flow of the separation gas is defined below the gas supply/exhaust unit 4. Thus, a region to which the DCS gas is discharged and a region outside the separation gas discharge port 43 are defined. The DCS gas supplied to the region surrounded by the curtain of the air flow of the separation gas is exhausted together with the separation gas from the exhaust ports 42.

Returning to FIG. 2, the reaction gas nozzle 51 and the modifying gas nozzle 52 have substantially the same configuration except that gases to be discharged are different. Each of the reaction gas nozzle 51 and the modifying gas nozzle 52 is configured as an elongated tubular body with its distal end closed. Each of the reaction gas nozzle 51 and the modifying gas nozzle 52 is installed to extend horizontally from the side wall of the vacuum container 1 toward the center of the rotary table 2 and intersect the passage region of the wafer W above the rotary table 2. At the forward side in the rotational direction of the rotary table 2, gas discharge ports 51*a* and 52*a* for discharging gases therethrough are respectively formed in lateral surfaces of the reaction gas nozzle 51 and the modifying gas nozzle 52 step by step in the lengthwise direction.

One end of a reaction gas supply pipe 53 is connected to a proximal end of the reaction gas nozzle 51. The other end of the reaction gas supply pipe 53 is coupled to an NH$_3$ gas supply source 56 filled with an ammonia (NH$_3$) gas. One end of a hydrogen (H$_2$) gas supply pipe 55 is connected to the reaction gas supply pipe 53. A H$_2$ gas supply source 57 is connected to the other end of the H$_2$ gas supply pipe 55. One end of a modifying gas supply pipe 54 is connected to a proximal end of the modifying gas nozzle 52. A H$_2$ gas supply source 58 filled with a H$_2$ gas is connected to the other end of the modifying gas supply pipe 54. In FIG. 2, reference numerals V53, V54 and V55 denote valves installed in the reaction gas supply pipe 53, the modifying gas supply pipe 54 and the H$_2$ gas supply pipe 55, respectively. Reference numerals M53, M54 and M55 denote flow rate adjustment parts installed in the reaction gas supply pipe 53, the modifying gas supply pipe 54 and the H$_2$ gas supply pipe 55, respectively.

Further, a plasma generating part 81 is installed above a region extending from the respective positions of the reaction gas nozzle 51 and the modifying gas nozzle 52 in the top plate portion 11 to the forward side. As shown in FIGS. 1 and 2, the plasma generating part 81 is formed by winding an antenna 83 made of, for example, a metal wire in a coil shape, and is housed in a housing 80 made of, for example, quartz or the like. The antenna 83 is coupled to a high frequency power supply 85 having a frequency of 13.56 MHz and an output power of, for example, 5,000 W, through a connection electrode 86 having a matching device 84 disposed therein. In the figures, reference numeral 82 denotes a Faraday shield for shielding an electric field generated from the high frequency generating part, and reference numeral 87 denotes slits for allowing a magnetic field generated from the high frequency generating part to reach the wafer W. Reference numeral 89 denotes an insulating plate installed between the Faraday shield 82 and the antenna 83.

In a processing space defined above the rotary table 2, a region below the gas supply/exhaust unit 4 corresponds to an adsorption region where the DCS gas is adsorbed. A region defined below the reaction gas nozzle 51 corresponds to a reaction region where the DCS gas is nitrided. A region defined below the plasma generating part 81 installed to correspond to the modifying gas nozzle 52 corresponds to a modification region in which a SiN film is modified by plasma.

Further, a separation region 60 is formed in a region of the backward side of the modifying gas nozzle 52 and the forward side of the plasma generating part 81 installed to correspond to the reaction gas nozzle 51 in the rotational direction of the rotary table 2. A ceiling surface of the separation region 60 is set to be lower than a ceiling surface on which the plasma generating part 81 is installed. The separation region 60 is provided to prevent an $NH_3$ gas supplied to the backward side in the rotational direction of the rotary table 2 with respect to the separation region 60 from being diluted by mixing with a gas supplied to the forward side in the rotational direction with respect to the separation region 60. In addition, since the gas supply/exhaust unit 4 can also form a curtain of the separation gas so as to intersect the passage region of the wafer W, it can be said that the separation gas supplied from the gas supply/exhaust unit 4 prevents a gas supplied from the reaction gas nozzle 51 from being diluted by a gas supplied from the modifying gas nozzle 52.

Further, as shown in FIG. 2, exhaust ports 61 and 62 are respectively opened outside the rotary table 2 at the forward sides of the reaction gas nozzle 51 and the modifying gas nozzle 52 when viewed in the rotational direction of the rotary table 2. Reference numeral 64 in FIG. 1 denotes an exhaust device which is constituted by a vacuum pump or the like, and is coupled to the exhaust ports 61 and 62 via an exhaust pipe.

Figure 5:
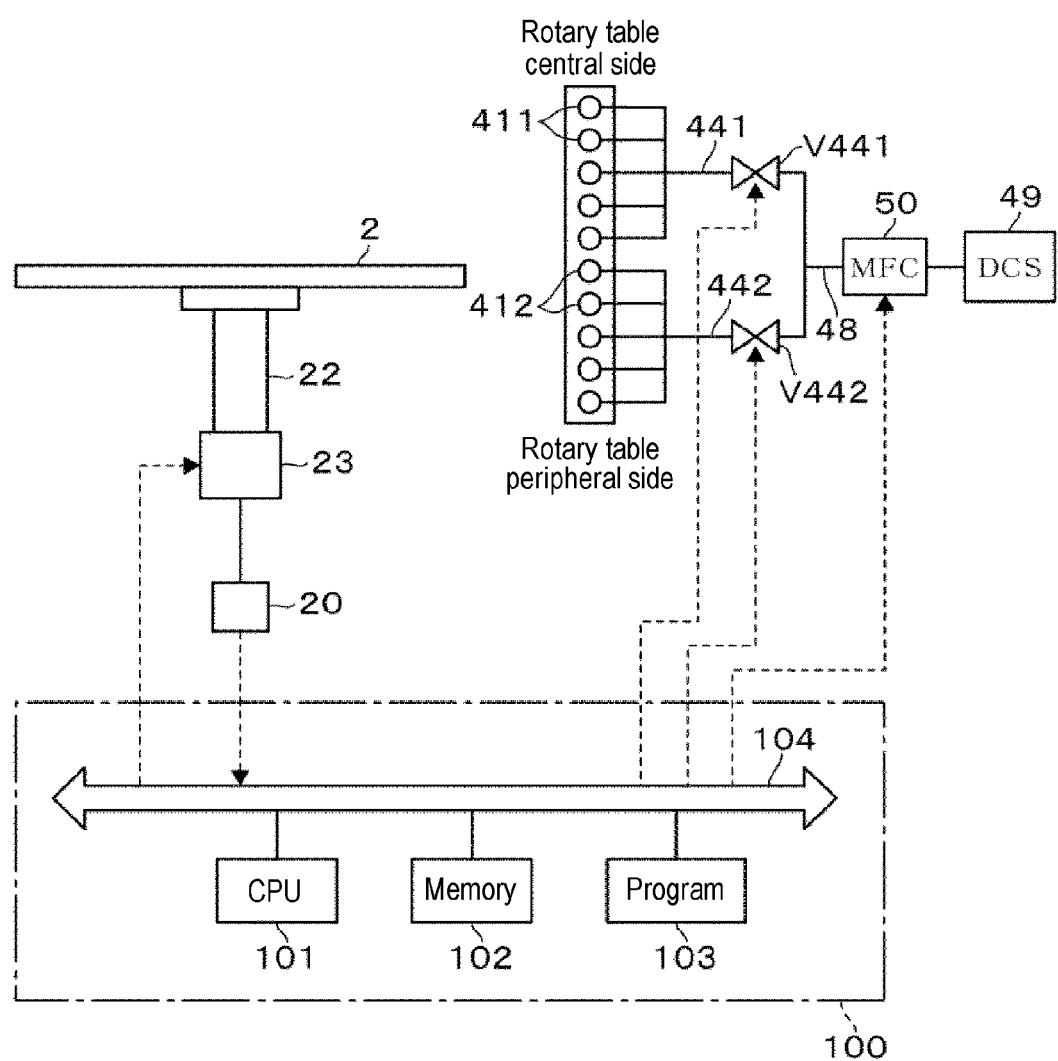
FIG. 5 is a configuration diagram of a control part.

As shown in FIG. 1, the film-forming apparatus is provided with a control part 100 including a computer for controlling the overall operation of the apparatus. Referring also to FIG. 5, the control part 100 includes a CPU 101, a memory 102 and a program storage part 103 in which a program for executing a group of steps according to a wafer film-forming process and a film thickness adjusting process which will be described later. In the figure, reference numeral 104 denotes a bus. In addition, the control part 100 is configured to receive an encode value indicating a rotational angle of the rotary table 2, which is read by the encoder 20. Further, the control part 100 is configured to output a control signal for controlling the rotation mechanism 23 to control the rotation of the rotary table 2 and also output a control signal for controlling the opening and closing of the central-side valve V441 and the peripheral-side valve V442 to switch the supply and cutoff of the DCS gas discharged from the DCS gas discharge ports 41. Furthermore, the control part 100 is configured to output a control signal for controlling the MFC 50 to adjust the flow rate of the DCS gas. Incidentally, even when switching the supply of the DCS gas to the OFF state to set the flow rate of the DCS gas to zero, it is included in the adjustment of the flow rate.

The memory 102 stores a data table in which an encoder value of the rotary table 2, which indicates the correspondence between the position of the gas supply/exhaust unit 4 and the position of the wafer W when the DCS gas is supplied onto the wafer W in the film thickness adjusting process to be described later, a DCS gas supply amount, and the supply and cutoff of the gases discharged from the central-side gas discharge ports 411 and the peripheral-side gas discharge ports 412, are associated with each other.

Figure 6:
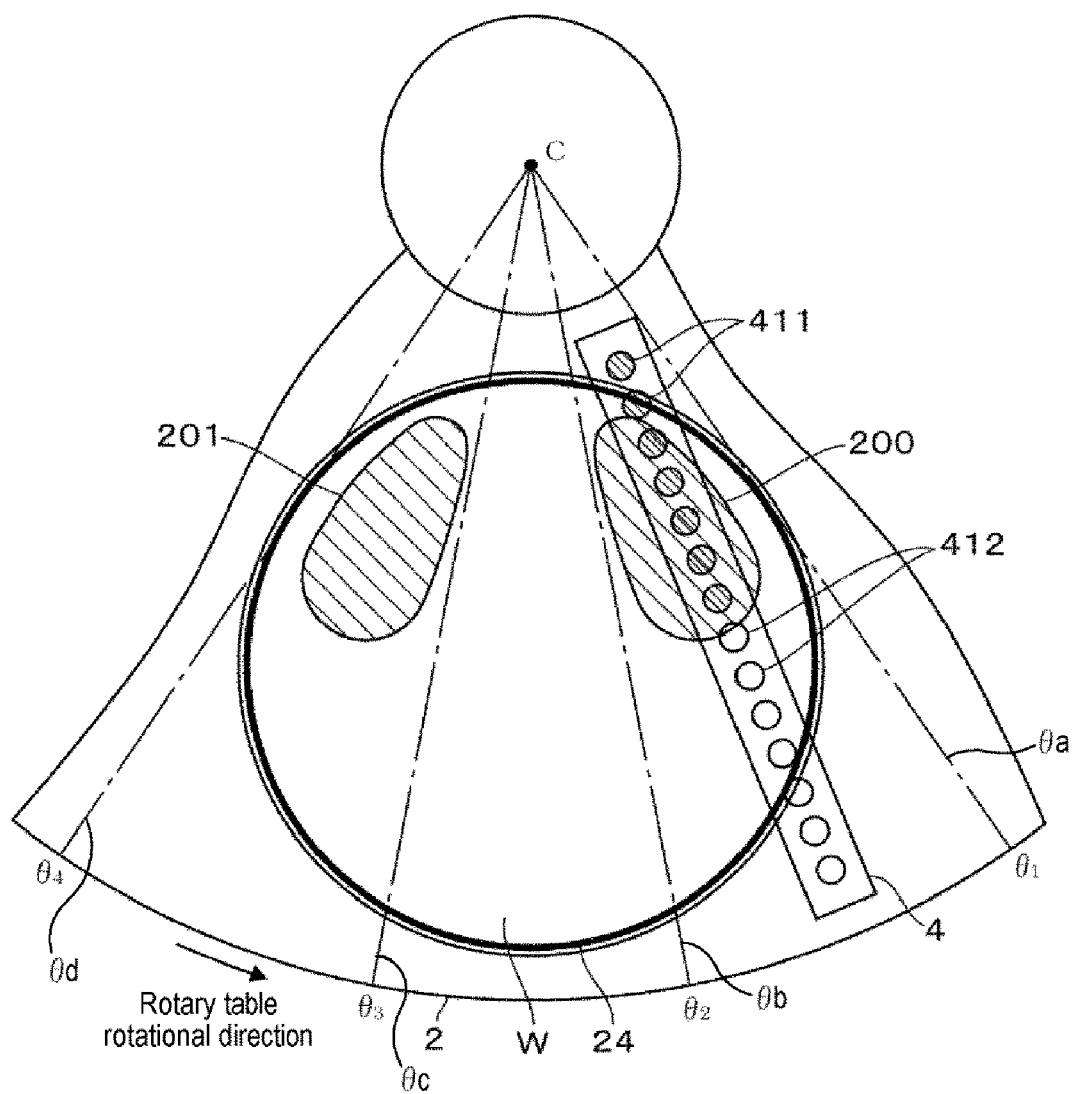
FIG. 6 is an explanatory view for explaining data written in a data table.

Data of the data table will be described with reference to FIGS. 6 and 7. The supply flow rate of DCS gas, which is set by the MFC 50, is assumed to be adjusted constantly. FIG. 6 schematically shows an example of a film thickness distribution on a surface of a wafer W after a film-forming process to be described later is performed on the wafer W using the film-forming apparatus according to the first embodiment. As shown in FIG. 6, for example, the wafer W may have portions 200 and 201. The portion 200 is formed near the center of the rotary table 2 at the peripheral edge of the wafer W at the forward side, and the portion 201 is formed near the center of the rotary table at the peripheral portion of the wafer W at the backward side. Each of the portions 200 and 201 has a small thickness of about 1 Å. For this reason, a film thickness of the wafer W subjected to the film-forming process is measured in advance. A data table is prepared to supply a precursor gas to a portion where the film thickness becomes thin in the film-forming process in a film thickness adjusting process (film thickness adjustment) performed subsequent to the film-forming process.

Dashed lines θa to θd in FIG. 6 indicate positions of the gas supply/exhaust unit 4 when the rotational angle of the rotary table 2 is θ1 to θ4. Values of the encoder when the rotational angle of the rotary table 2 is θ1 to θ4 are assumed to be n1 to n4, respectively. For example, before the rotational angle of the rotary table 2 reaches θ1, the gas supply/exhaust unit 4 is in front of the wafer W and does not reach above the wafer W. Thus, it is not necessary to supply the DCS gas. Therefore, as shown in FIG. 7, the data table is prepared so that the central-side valve V441 is closed and the peripheral-side valve V442 is closed with respect to an encoder value (~n1) before the rotational angle reaches θ1.

Subsequently, when the rotational angle of the rotary table 2 falls within a range of θ1 to θ2, the gas supply/exhaust unit 4 is located above a region near the forward side in the wafer W. At this time, as shown in FIG. 6, the central-side gas discharge ports 411 is located above the portion 200 having a relatively thin film thickness, which is formed near the forward side in the wafer W, and the peripheral-side gas discharge ports 412 is located at a position spaced apart from above the portion 200. Therefore, it is only necessary to supply the DCS gas from the DCS gas discharge ports 41 arranged close to the center of the rotary table 2 in the gas supply/exhaust unit 4. Thus, as shown in FIG. 7, the data table is prepared so that the central-side valve V441 is opened and the peripheral-side valve V442 is closed with respect to the encoder values n1 to n2 when the rotational angle falls within a range of θ1 to θ2.

Subsequently, when the rotational angle of the rotary table 2 falls within a range of θ2 to θ3, the gas supply/exhaust unit 4 is located above a region where film formation is uniformly performed in the film-forming process. This eliminates the need to supply the DCS gas. Therefore, the data table is prepared so that the central-side valve V441 is closed and the peripheral-side valve V442 is closed with respect to the encoder values n2 to n3 when the rotational angle falls within a range of θ2 to θ3.

When the rotational angle of the rotary table 2 falls within a range of θ3 to θ4, the central-side gas discharge ports 411 are located above the portion 201 having a relatively thin film thickness near the backward side in the wafer W, and the peripheral-side gas discharge ports 412 are located at a position spaced apart from above the portion 201. Accordingly, as shown in FIG. 7, the data table is prepared so that the central-side valve V441 is opened and the peripheral-side valve V442 is closed with respect to the encoder values n3 to n4 when the rotational angle falls within a range of θ3 to θ4. Further, before the rotational angle of the rotary table 2 reaches θ4, as shown in FIG. 7, the data table is prepared so that the central-side valve V441 is closed and the peripheral-side valve V442 is closed with respect to an encoder value (n4~) after the rotational angle reaches θ4.

Likewise, even at the rotational angle at which the gas supply/exhaust unit 4 is located above another wafer W mounted on the rotary table 2, in order to supply the DCS gas to a thin portion of the film formed on the wafer W in a limited manner, a data table is created so that an encoder value corresponding to the rotational angle of the rotary table 2 is associated with the opening/closing of the central-side valve V441 and the peripheral-side valve V442.

Then, a program starts each step of the film thickness adjusting process after executing each step of the film-forming process (to be described later), and reads the supply amount of the DCS gas and the opening/closing data of the central-side valve V441 and the peripheral-side valve V442 from the data table in accordance with the encoder values of the rotary table 2 while rotating the rotary table 2. Further, the program outputs control signals to the MFC 50, the central-side valve V441 and the peripheral-side valve V442 to operate them to supply a precursor gas in the film thickness adjusting process. The program is stored and installed on a storage medium such as a hard disk, a compact disk, a magneto-optical disk, a memory card, a flexible disk or the like.

The operation of the first embodiment will be described below. First, the gate valve 17 is opened. Four wafers W are delivered on the respective recesses 24 of the rotary table 2 in cooperation between the lift pins and the substrate transfer mechanism as described previously, while rotating the rotary table 2 intermittently. Subsequently, the gate valve 17 is closed to make the interior of the vacuum container 1 airtight. The wafers W mounted on the respective recesses 24 are heated to, for example, 500 degrees C. or higher, specifically 550 degrees C., by the heater 7. Then, the interior of the vacuum container 1 is kept in a vacuum atmosphere of a pressure of, for example, 2 torr (266.6 Pa) by the exhaust performed from the exhaust ports 61 and 62. The rotary table 2 is rotated clockwise at a rotation speed of 1 to 300 rpm, specifically 30 rpm.

Then, an NH$_3$ gas and a H$_2$ gas are supplied from the reaction gas nozzle 51, and a H$_2$ gas is supplied from the modifying gas nozzle 52. While each gas is being supplied in this manner, a high frequency is supplied from the plasma generating part 81. With this high frequency, plasma of the H$_2$ gas and the NH$_3$ gas supplied from the reaction gas nozzle 51 is generated, and plasma of the H$_2$ gas supplied from the modifying gas nozzle 52 is generated. In the gas supply/exhaust unit 4, both the central-side valve V441 and the peripheral-side valve V442 are opened to supply a DCS gas from all the DCS gas discharge ports 41. An Ar gas is discharged from the separation gas discharge port 43, and the exhaust is performed from the exhaust ports 42.

Further, when a wafer W is located below the gas supply/exhaust unit 4 by rotating the rotary table 2, the DCS gas is supplied and adsorbed onto the surface of the wafer W. When the wafer W reaches below the reaction gas nozzle 51 by further rotating the rotary table 2, DCS adsorbed onto the wafer W reacts with NH$_3$ to generate SiN which is a reaction product. Chlorine (Cl) remaining on the wafer W is removed by active species of hydrogen produced when the H$_2$ gas supplied to the respective region is plasmarized.

When the wafer W reaches below the modifying gas nozzle 52 by further rotating the rotary table 2, Cl remaining on the wafer W is removed by active species of hydrogen in a similar manner. Thereafter, the wafer W enters below the gas supply/exhaust unit 4 and the DCS is again adsorbed onto the wafer W.

In this way, as the rotary table 2 continuously rotates, the wafers W repeatedly pass a plurality of times below the gas supply/exhaust unit 4, below the reaction gas nozzle 51 and below the modifying gas nozzle 52 in this order. As a result, SiN is deposited on the surface of each wafer W, thereby increasing a film thickness of the SiN film and modifying the SiN film.

While the wafer W is revolving in this way, the film-forming process of forming the SiN film on the entire surface of the wafer is performed. At this time, in the film-forming process, the SiN film formed on the wafer W has the portions 200 and 201 having a relatively thin film thickness of about 1 Å, which are formed at the central side of the rotary table 2 in the peripheral edges at the forward and backward sides in the wafer W as shown in FIG. 6. The portions 200 and 201 are formed due to turbulence of air flow, non-uniformity of plasma during a plasma process and the like, which depend on a shape of the recess that receives the wafer W.

For this reason, the film thickness adjusting process of supplying a gas toward such a thin film thickness portion in the wafer W to form a film, is performed. First, the central-side valve V441 and the peripheral-side valve V442 are closed to stop the discharge of the DCS gas in the gas supply/exhaust unit 4. At this time, the generation of plasma by the plasma generating part 81 and the supply of gases from the reaction gas nozzle 51 and the modifying gas nozzle 52 are continued.

Further, the rotation speed of the rotary table 2 is lowered to, for example, 1 rpm. The rotation of the rotary table 2 in the film thickness adjusting process may be a step operation (index) in which the rotation of a very small angle and the stop of the rotary table 2 are alternately repeated. Further, according to the rotational angle of the rotary table 2, namely an encoder value obtained when the rotary table 2 is rotated in this example, the opening/closing data of the central-side valve V441 and the peripheral-side valve V442 for controlling the supply and cutoff of the gases discharged from the central-side gas discharge ports 411 and the peripheral-side gas discharge ports 412, is read from the data table shown in FIG. 7. In FIGS. 8 to 12, symbol O is attached to a respective valve when each of the central-side valve V441 and the peripheral-side valve V442 is opened, and symbol C is attached to a respective valve when the respective valve is closed. The closed valve is also shown by hatching. In addition, dots are attached to the portions 200 and 201 having a relatively thin film thickness in the wafer W. A region where a precursor gas is adsorbed in the film thickness adjusting process is shown by hatching.

Figures 7, 8:
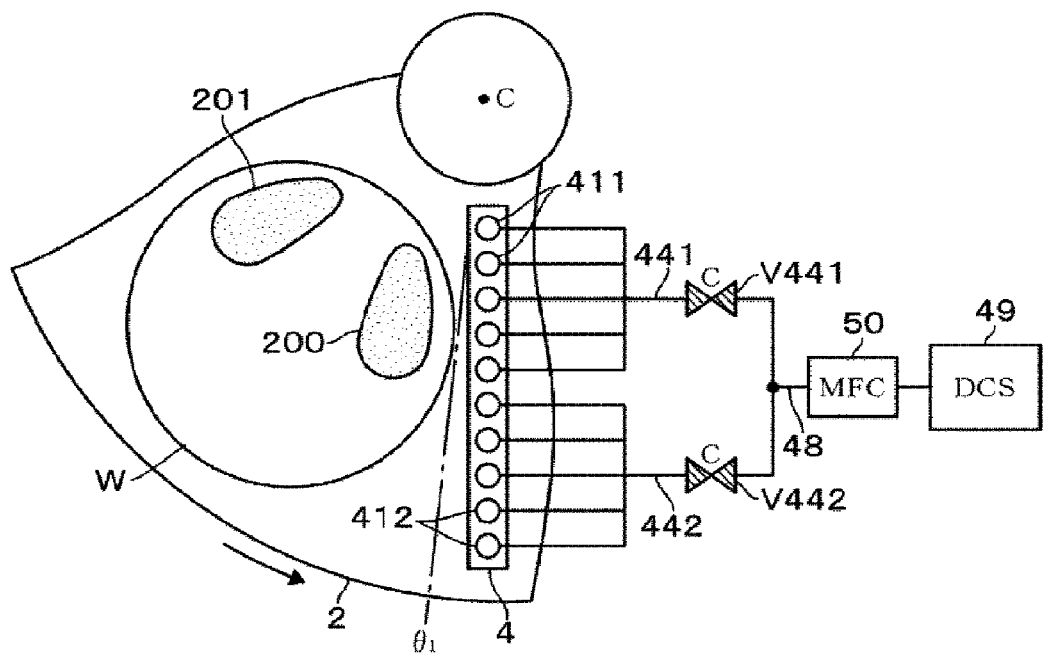
FIG. 7 is an explanatory view showing an example of the data table.
FIG. 8 is an explanatory view showing an operation of the first embodiment.

For example, before the rotational angle of the rotary table 2 reaches θ1, the gas supply/exhaust unit 4 is located in front of the wafer W, as shown in FIG. 8. Since the encoder value at this time is n1 or less, as shown in the data table of FIG. 7, a control signal for closing the central-side valve V441 and closing the peripheral-side valve V442 is outputted from the control part 100 so that a flow rate of the DCS gas discharged from each DCS gas discharge port 41 is zero.

Figure 9:
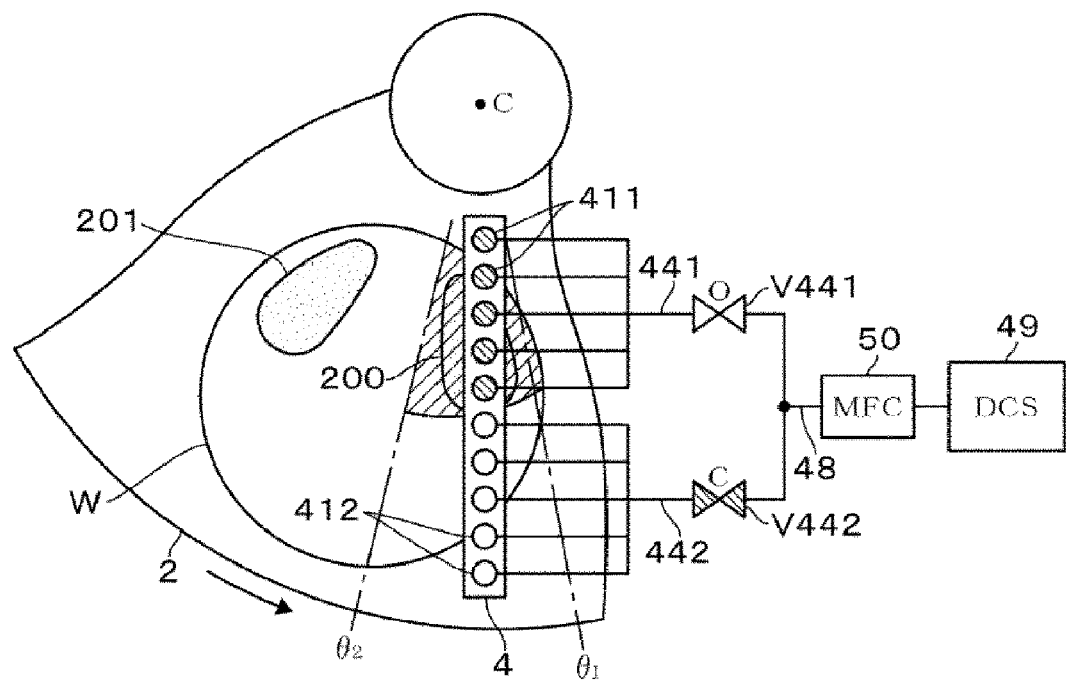
FIG. 9 is an explanatory view showing an operation of the first embodiment.

When the rotational angle of the rotary table 2 exceeds θ1 by further rotating the rotary table 2, namely falls within a range of θ1 to θ2, as shown in FIG. 9, a peripheral edge portion of the forward side in the wafer W is located below the gas supply/exhaust unit 4. At this time, in the gas supply/exhaust unit 4, the central-side gas discharge ports 411 are located above the portion 200 having a relatively thin film thickness in the wafer W, and the peripheral-side gas discharge ports 412 are located above a region spaced apart from the portion 200 having a relatively thin film thickness in the wafer W.

At this time, since the encoder value falls within a range of n1 to n2, the control part 100 outputs a control signal for opening the central-side valve V441 and closing the peripheral-side valve V442, as shown in the data table of FIG. 7. Therefore, as shown in FIG. 9, when the rotational angle of the rotary table 2 falls within a range of θ1 to θ2, a DCS gas is discharged from the DCS gas discharge ports 41 near the center of the rotary table 2 in the gas supply/exhaust unit 4. The DCS gas is supplied toward a portion below the DCS gas discharge ports 41 in the wafer W, namely the portion 200 having a relatively thin film thickness, which is located near the center of the rotary table 2 at the forward side in the wafer W. Further, no precursor gas is supplied to a portion having a sufficient thick film thickness at the forward side of the wafer W in the peripheral edge side of the rotary table 2.

Figure 10:
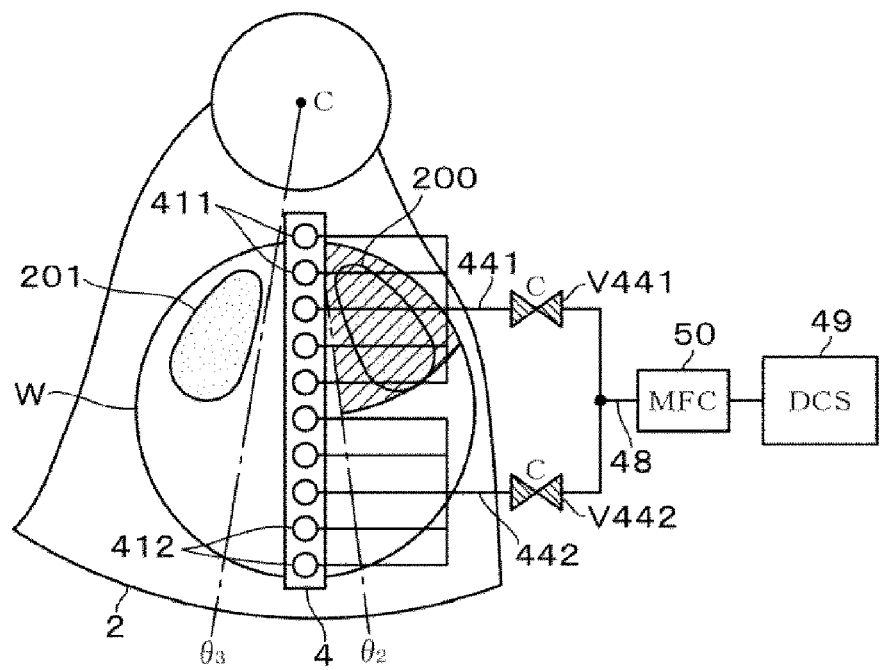
FIG. 10 is an explanatory view showing an operation of the first embodiment.

Subsequently, when the rotational angle of the rotary table falls within a range of θ2 to θ3 as shown in FIG. 10 by further rotating the rotary table 2, the gas supply/exhaust unit 4 is located in a region near the center of the wafer W. In the region, the film thickness is thick and uniform in the film-forming process. At this time, since the encoder value falls within a range of n2 to n3, the control unit 100 outputs a control signal for closing the central-side valve V441 and closing the peripheral-side valve V442. Therefore, when the rotational angle of the rotary table 2 falls within a range of θ2 to θ3, the flow rate of the DCS gas discharged from each DCS gas discharge ports 41 is zero. That is to say, no DCS gas is discharged. Therefore, no DCS gas is adsorbed onto a region having a uniform film thickness near the center of the wafer W.

Figure 11:
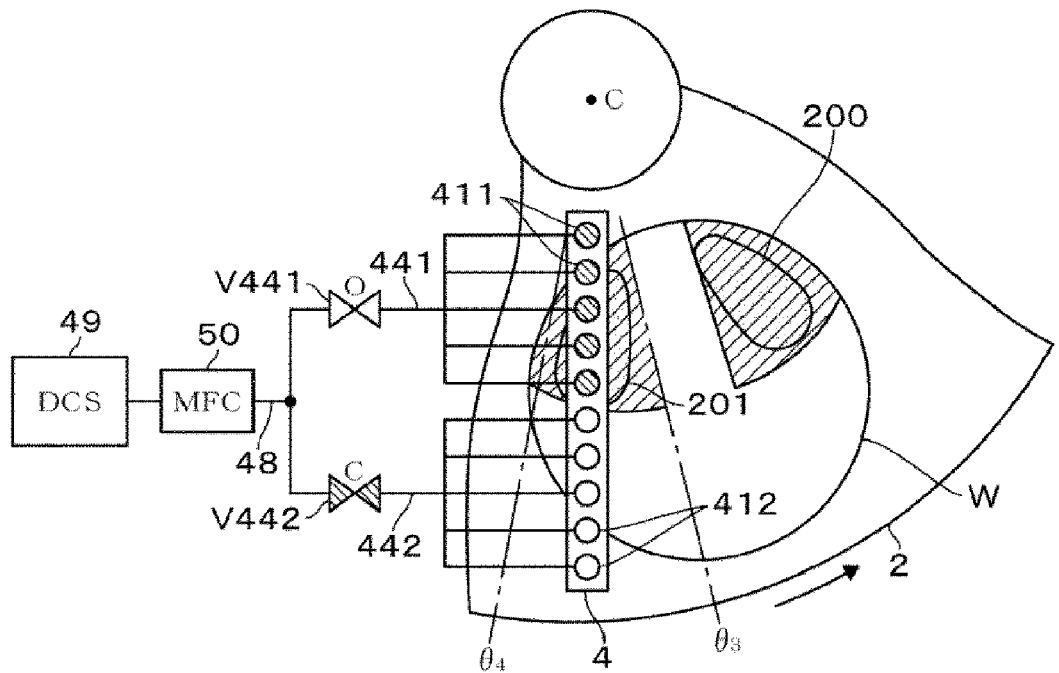
FIG. 11 is an explanatory view showing an operation of the first embodiment.

Subsequently, when the rotational angle of the rotary table 2 falls within a range of θ3 to θ4 as shown in FIG. 11 by further rotating the rotary table 2, a peripheral edge portion of the backward side of the wafer W is located below the gas supply/exhaust unit 4. At this time, in the gas supply/exhaust unit 4, the central-side gas discharge ports 411 are located above the portion 201 having a relatively thin film thickness in the wafer W, and the peripheral-side gas discharge ports 412 are located above a region spaced apart from the portion 201 having a relatively thin film thickness in the wafer W.

When the rotational angle of the rotary table 2 falls within a range of θ3 to θ4, the encoder value falls within a range of n3 to n4. Thus, the control unit 100 outputs a control signal for opening the central-side valve V441 and closing the peripheral-side valve V442. As a result, the DCS gas is supplied and adsorbed onto the portion 201 having a relatively thin film thickness, which is located near the center of the rotary table 2 at the peripheral edge of the backward side of the wafer W. Further, no DCS gas is discharged and adsorbed onto a region near the peripheral edge of the rotary table 2 in the peripheral edge of the backward side of the wafer W.

Figure 12:
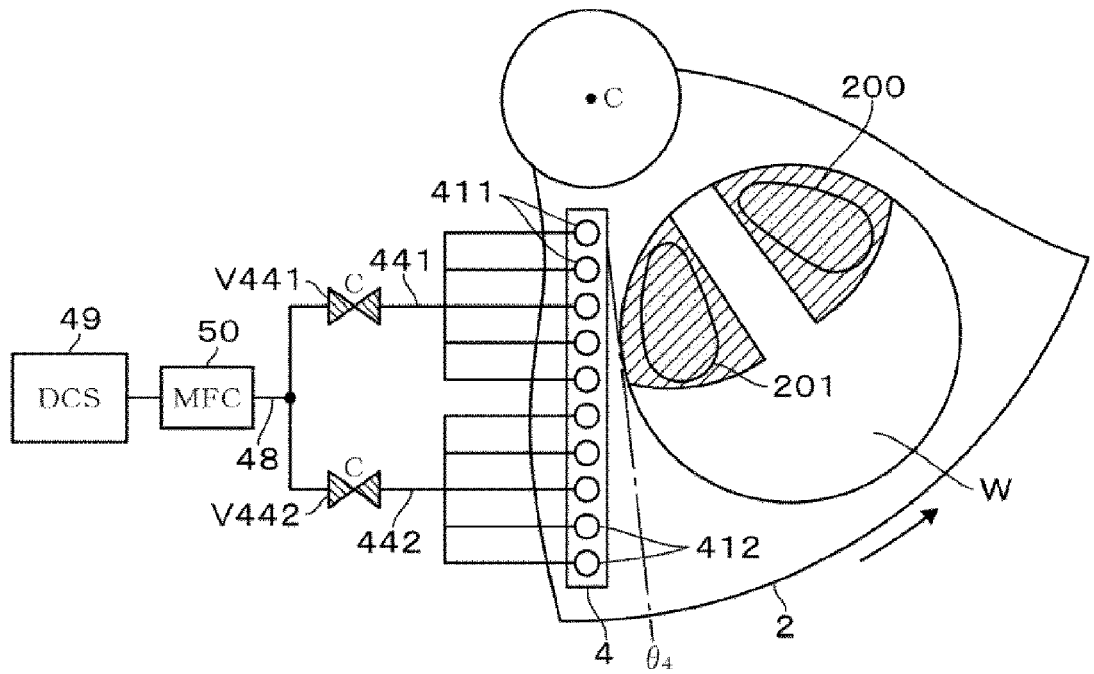
FIG. 12 is an explanatory view showing an operation of the first embodiment.

As shown in FIG. 12, when the rotational angle of the rotary table 2 exceeds θ4, the encoder value exceeds n4. Therefore, the control unit 100 outputs a control signal for closing the central-side valve V441 and closing the peripheral-side valve V442 so that a flow rate of the DCS gas discharged from each DCS gas discharge port 41 becomes zero.

Subsequently, when further rotating the rotary table 2, the wafer W passes below the reaction gas nozzle 51 and below the modifying gas nozzle 52 in this order. Thus, the DCS gas adsorbed onto the wafer W reacts with $NH_3$ to form SiN. In the film thickness adjusting process, since the DCS gas is adsorbed only onto the central region of the rotary table 2 in each of the forward-side peripheral edge and the backward-side peripheral edge of the wafer W, the DCS gas reacts with an $NH_3$ gas only in the respective region to form SiN.

The forward-side peripheral edge portion and the backward-side peripheral edge portion of the wafer W at the central side of the rotary table 2 are the portions 200 and 201 having a relatively thin film thickness in the film-forming process as described above. Thus, the film-forming process can be limitedly performed so as to compensate for the film thickness of the portions 200 and 201 having a relatively thin film thickness when being subjected the film-forming process. Likewise, with respect to another wafer W, the film thickness is compensated by adsorbing the DCS gas onto a portion having a relatively thin thickness in the wafer W.

According to the above-described embodiment, in the film-forming apparatus that supplies a gas toward a wafer W to form a film on the wafer W, a DCS gas and an $NH_3$ gas are alternately supplied onto the revolving wafer W to perform the film-forming process. Further, in the film thickness adjusting process, the central-side valve V441 and the peripheral-side valve V442 are operated based on the rotational angle of the rotary table 2 so that the supply and cutoff of the DCS gas discharged from the central-side gas discharge ports 411 and the peripheral-side gas discharge ports 412 in the gas supply/exhaust unit 4 is adjusted. Therefore, the DCS gas can be limitedly attached onto the portions 200 and 201 having a relatively thin film thickness in a film of the wafer W, which is formed by the film-forming process. It is therefore possible to compensate for the film thickness of the portions 200 and 201 having a relatively thin film thickness in the film-forming process. This improves the film thickness uniformity of a film formed on the wafer W.

Further, in the present disclosure, the film thickness adjusting process may include a step of supplying a film thickness adjusting gas to the wafer W and a step of supplying a reaction gas. The steps may be repeated in plural cycles. Further, in the film thickness adjusting process, a flow rate of the MFC 50 may be adjusted. In this case, a set value of the flow rate of the MFC in the data table shown in FIG. 7 may be changed according to an encoder value.

In the above-described embodiment, the DCS gas discharge ports 41 are divided into two groups of the central-side gas discharge ports 411 and the peripheral-side gas discharge ports 412. However, the DCS gas discharge ports 41 may be divided into three or more groups, and flow rate levels of the groups may be adjusted independently of each other. Further, the flow rate of DCS gas supplied from each of the DCS gas discharge ports 41 may be individually adjusted so that the horizontal distribution of the gas flow rates can be adjusted. In this case, in the film thickness adjusting process, a flow rate of the DCS gas discharged from a DCS gas discharge port 41, corresponding to a portion where the film thickness is limitedly increased, may be set to be larger than that of the DCS gas supplied from the other DCS gas discharge ports 41. Incidentally, adjusting the flow rate of a gas encompasses a case where the flow rate of a gas discharged from the DCS gas discharge ports 41 is set to zero.

With the above configuration, it is possible to supply the precursor gas at a large amount limitedly to a portion having a relatively thin film thickness in a film formed by the film-forming process, and to compensate for the film thickness of a portion having a relatively thin film thickness in the wafer W by the film-forming process, in the film thickness adjusting process. This provides the same effects as those in the above embodiment.

In some embodiments, the film thickness adjusting process may include stopping the movement of the wafer W, supplying a precursor gas, temporarily stopping the supply of the precursor gas, resuming the movement of the wafer W, changing gas discharge ports for discharging a gas, changing a position at which the precursor gas is adsorbed on the wafer W, stopping the rotation of the rotary table 2, and supplying the precursor gas.

Alternatively, for example, gas discharge ports may be dispersedly formed over the entire lower surface of a disk-shaped gas supply part to supply a gas to the entire surface of the wafer W. In this case, when performing the film thickness adjusting process, a flow rate of DCS gas discharged from the gas discharge ports may be adjusted.

Figure 13:
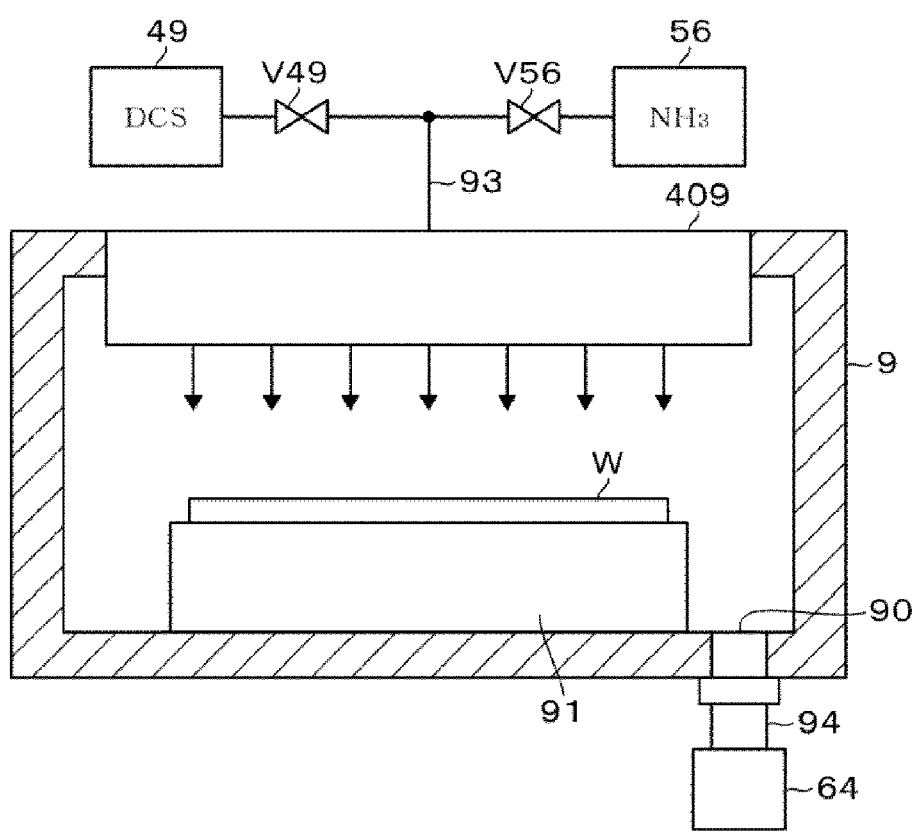
FIG. 13 is a cross-sectional view showing another example of the film-forming apparatus according to the first embodiment.

In some embodiments, the present disclosure may be applied to a single wafer type film-forming apparatus in which a gas is supplied toward a single substrate mounted on a mounting table to form a film. For example, as shown in FIG. 13, a mounting table 91 is installed inside a vacuum container 9. A shower head 409 serving as a gas supply part for supplying a gas toward the entire surface of the wafer W is installed so as to face the wafer W mounted on the mounting table 91. Further, an exhaust port 92 is formed in the vacuum container 9. An exhaust device 64 is connected to the exhaust port 92 via an exhaust pipe 94.

In some embodiments, a plurality of gas discharge ports may be arranged dispersedly in the lower surface of the shower head 409, and the lower surface of the shower head 409 may be divided into a plurality of regions. Discharge of gas may be switched for each region. In this example, one end of a gas supply pipe 93 is connected to the shower head 409, and the other end of the gas supply pipe 93 branches into two ends to which the DCS gas supply source 49 and the NH$_3$ gas supply source 56 are respectively connected. Reference numerals V49 and V56 in FIG. 13 denote valves.

In such a film-forming apparatus, a film-forming process is performed by supplying a precursor gas onto the entire surface of the wafer W and allowing the precursor gas to react with a reaction gas. Subsequently, in a film thickness adjusting process, in order to adjust the film thickness, a film thickness adjustment-purpose precursor gas may be discharged only to a region corresponding to a portion having a relatively thin film thickness in the wafer W by the film-forming process.

Further, the present disclosure may be applied to a film-forming apparatus in which a substrate is linearly moved, and a precursor gas and a reaction gas are supplied toward a movement region of the substrate.

Further, after the wafer W is subjected to the film-forming process, a film thickness distribution of the wafer W may be measured using, for example, a Fourier transform infrared spectrophotometer (FT-IR). Based on data of the film thickness distribution measured for each wafer W, an encoder value and DCS gas discharge ports 41 for discharging a DCS gas may be set so that the DCS gas can be limitedly supplied toward a portion having a relatively thin film thickness. In this way, the film thickness adjusting process may be performed.

Further, a precursor gas supply part may be configured to supply a purge gas from DCS gas discharge ports 41 which supply no DCS gas. Furthermore, a separation gas discharge port and a discharge port may not be formed in the precursor gas supply part.

Second Embodiment

Further, the film-forming apparatus of the present disclosure may be configured to include a main precursor gas supply part that supplies a precursor gas when a film-forming process is performed on a wafer W, and a film thickness adjusting gas supply part that supplies a film thickness adjustment-purpose precursor gas to the wafer W.

Figure 14:
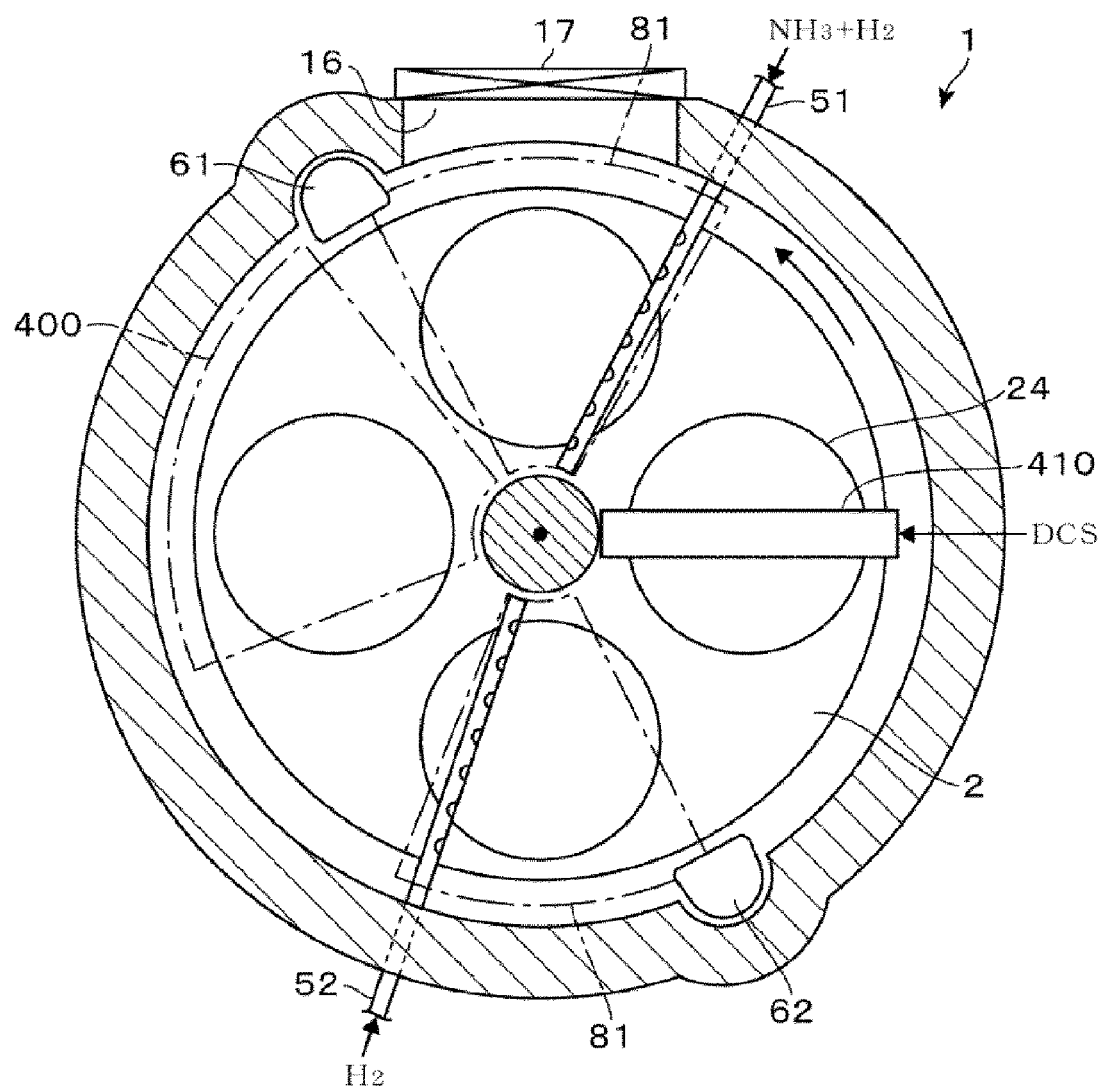
FIG. 14 is a plan view showing a film-forming apparatus according to a second embodiment.

For example, as shown in FIG. 14, a main gas supply/exhaust unit 400 for supplying a gas in the film-forming process is installed between the plasma generating part 81 corresponding to the reaction gas nozzle 51 and the modifying gas nozzle 52 in the film-forming apparatus shown in FIG. 2. An auxiliary gas supply/exhaust unit 410 having the same configuration as the gas supply/exhaust unit 4 shown in FIGS. 3 and 4 is installed at the forward side of the modifying gas nozzle 52. In this example, since a separation gas for separating a gas supplied from the reaction gas nozzle 51 and a gas supplied from the modifying gas nozzle 52 from each other can be supplied from the main gas supply/exhaust unit 400, the separation region 60 is removed.

Figure 15:
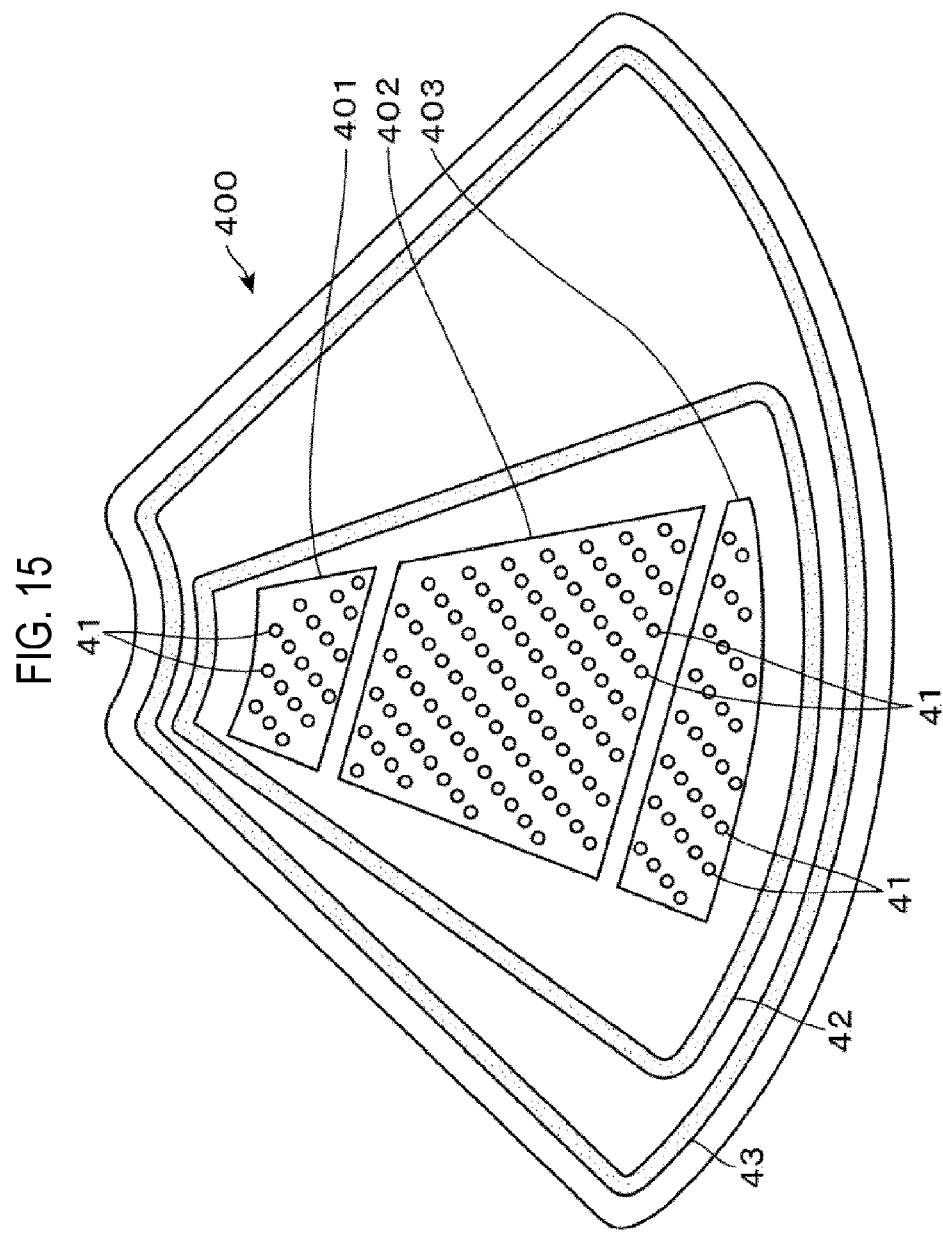
FIG. 15 is a bottom-side plan view of a main gas supply/exhaust unit.

As shown in FIGS. 14 and 15, the main gas supply/exhaust unit 400 is formed in a fan shape extending in the circumferential direction of the rotary table 2 from the central side of the rotary table 2 toward the peripheral side when viewed from top. The lower surface of the gas supply/exhaust unit 4 is close and faces the upper surface of the rotary table 2.

As shown in FIG. 15, gas discharge ports 41, an exhaust port 42 and a separation gas discharge port 43 are opened in the lower surface of the main gas supply/exhaust unit 400. The gas discharge ports 41 can discharge a DCS gas downward in the form of a shower onto the surface of the wafer W during rotation of the rotary table 2 in the film-forming process. Therefore, the main gas supply/exhaust unit 400 can supply a gas over a wider range than the auxiliary gas supply/exhaust unit 410.

Further, in the main gas supply/exhaust unit 400, three sections 401, 402 and 403 are set from the central side of the rotary table 2 toward the peripheral edge side of the rotary table 2. A DCS gas can be independently supplied to each of the gas discharge ports 41 formed dispersedly in the respective sections 401, 402 and 403. Therefore, for example, the flow rate of gas is adjusted so that it increases toward the peripheral edge side of the rotary table 2. Further, the exhaust port 42 and the separation gas discharge port 43 are formed to exhaust a gas and discharge a purge gas independently of each other, similarly to the gas supply/exhaust unit 4 shown in FIGS. 3 and 4.

In forming a film on the wafer W using the film-forming apparatus configured as above, for example, the discharge of a precursor gas and a purge gas from the main gas supply/exhaust unit 400 is started, and the exhaust is started. As in the first embodiment, a reaction gas and a reforming gas are discharged to excite plasma. At this time, in the auxiliary gas supply/exhaust unit 410, the discharge and exhaust of the purge gas is performed so that the central-side valve V441 and the peripheral-side valve V442 remain closed.

Then, the rotary table 2 is rotated at a rotation speed of, for example, 1 to 300 rpm. Thus, the DCS gas supplied from the main gas supply/exhaust unit 400 is adsorbed onto the wafer W and a film-forming process is performed. Thereafter, the discharge of the DCS gas in the main gas supply/exhaust unit 400 is stopped. Subsequently, the rotary table 2 is rotated at a rotation speed of 1 rpm or in a step operation (index), and an adjustment-purpose precursor gas is supplied by using the auxiliary gas supply/exhaust unit 410, for example, in accordance with the data table shown in FIG. 7. In this way, a film thickness adjusting process is performed.

The main gas supply/exhaust unit 400 has a configuration in which a large number of DCS gas discharge ports 41 are formed in a fan-like wide range where the peripheral edge side of the rotary table 2 expands, and a flow rate can be adjusted independently for each of the section 401, the section 402 and the section 403, which are arranged side by side from the central side of the rotary table toward the peripheral edge side. Therefore, it is possible to precisely control the film thickness in the film-forming process, thereby improving the uniformity of the film thickness in the film-forming process. Further, by further adjusting the film thickness with the auxiliary gas supply/exhaust unit 410, it is possible to further increase the uniformity of the film thickness.

Figure 16:
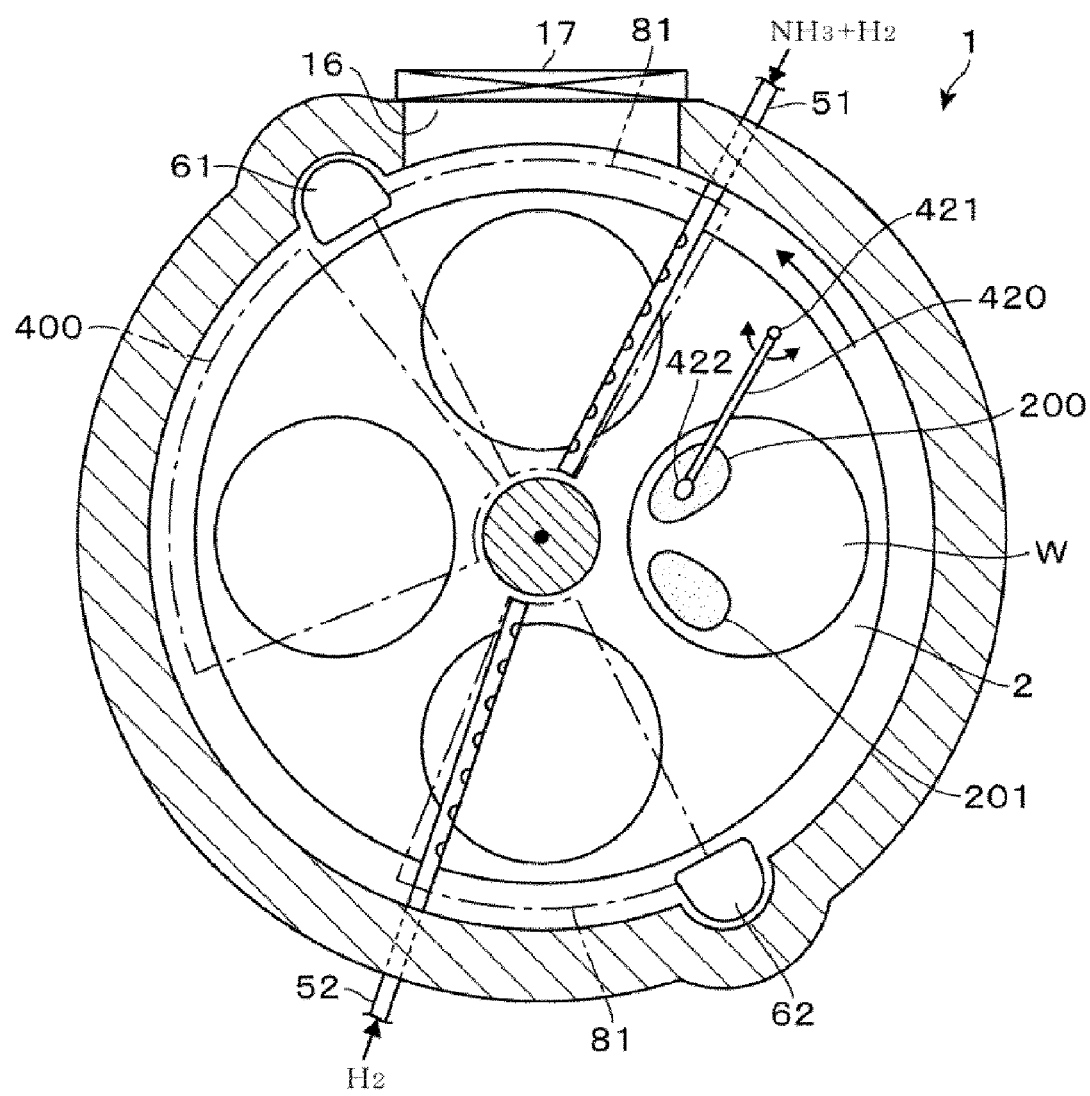
FIG. 16 is a plan view showing another example of the film-forming apparatus according to the second embodiment.

In the film-forming apparatus according to the second embodiment, the adjustment-purpose precursor gas supply part may be configured to move above the wafer W to supply the precursor gas to a portion having a relatively thin film thickness. For example, as shown in FIG. 16, the film-forming apparatus according to the second embodiment may have the same configuration as the film-forming apparatus shown in FIG. 14, except that an adjusting gas supply nozzle 422 is replaced for the auxiliary gas supply/exhaust unit 410.

The adjusting gas supply nozzle 422 is installed at, for example, at the distal end of a horizontally-extending support portion 420 and is configured to be swingable about a rotary shaft 421. With this configuration, a position on the wafer W is changed by the rotation of the rotary table 2 and the swing of the adjusting gas supply nozzle 422, and the precursor gas is supplied toward a portion where the film thickness is thinned on the wafer W in the film-forming process.

With such a configuration, it is possible to form a film so as to compensate for the film thickness of a portion where the film thickness is thinned on the wafer W in the film-forming process. This embodiment provides the same effects as those in the above embodiment.

Third Embodiment

Further, the present disclosure may be a film-forming apparatus provided with a plurality of precursor gas supply parts. For example, as shown in FIG. 17, two gas supply/exhaust units 4A and 4B having the same configuration as the gas supply/exhaust unit 4 shown in FIGS. 3 and 4 may be arranged so as to face each other with the center of the rotary table 2 located between the gas supply/exhaust units 4A and 4B.

Figure 17:
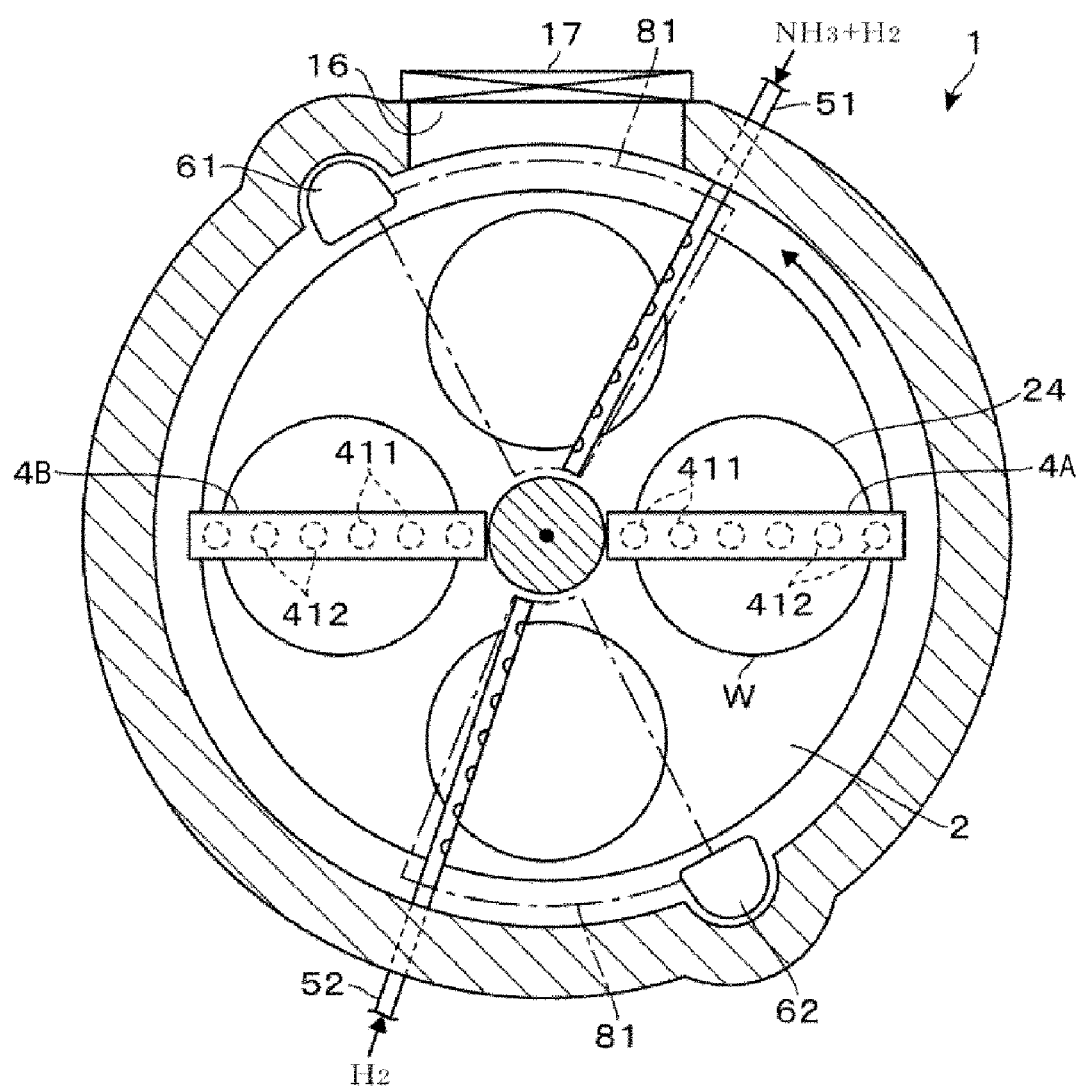
FIG. 17 is a plan view showing a film-forming apparatus according to a third embodiment.

In such a film-forming apparatus, assuming that a film-forming process is performed on four wafers as shown in FIG. 17, in supplying a precursor gas in a film thickness adjusting process, when the precursor gas is supplied by one gas supply/exhaust unit 4A (or 4B) toward a portion having a relatively thin film thickness in the wafer W, the precursor gas can be supplied by the other gas supply/exhaust unit 4B (or 4A) toward a portion having a relatively thin film thickness in the wafer W, which is at a position opposed to one wafer W via the center of the rotary table 2. Subsequently, the rotary table 2 may be rotated by 90 degrees to supply a gas from the gas supply/exhaust units 4A and 4B toward the remaining two wafers W. In this way, the film thickness adjusting process may be performed.

With such a configuration, in the film thickness adjusting process, the precursor gas can be supplied toward the plurality of wafers W at once. This shortens the time required to carry out the film thickness adjusting process on all the wafers W.

In a case where two portions where the film thickness is thinned in the film-forming process are formed, in the film thickness adjusting process, a precursor gas may be supplied from the gas supply/exhaust units 4A and 4B to the portions having different thin film thicknesses in the wafer W. For example, in the film thickness adjusting process, one gas supply/exhaust unit 4A (or 4B) may be formed at the central side of the rotary table 2 in the wafer W to supply the precursor gas to a portion having a relatively thin film thickness, and the other gas supply/exhaust unit 4B (or 4A) may be formed at the peripheral side of the rotary table 2 in the wafer W to supply the precursor gas to a portion having a relatively thin film thickness.

With this configuration, in the gas supply/exhaust units 4A and 4B, it is unnecessary to divide the gas discharge ports 41 for discharging the precursor gas into the central-side gas discharge ports 411 and the peripheral-side gas discharge ports 412. For example, in the film-forming process, for one portion having a relatively thin film thickness, a gas is supplied from the central-side gas discharge ports 411 and no gas is supplied from the peripheral-side gas discharge ports 412. On the other hand, for the other portion having a relatively thin film thickness, when no gas is supplied from the central-side gas discharge ports 411 but a gas is supplied from the peripheral-side gas discharge ports 412, it is necessary to switch the DCS gas discharge ports 41 for discharging a precursor gas between the central-side gas discharge ports 411 and the peripheral-side gas discharge ports 412 to perform the discharge and cutoff of the gas. In this case, resolutions of a region to which the precursor gas is supplied and a region to which no precursor gas is supplied are lowered, which may make the boundary therebetween ambiguous.

Therefore, according to the above embodiments, in the gas supply/exhaust units 4A and 4B, since it is unnecessary to switch the DCS gas discharge ports 41 for discharging a precursor gas between the central-side gas discharge ports 411 and the peripheral-side gas discharge ports 412, it is possible to perform a position control with high resolution of a region to which the precursor gas is supplied in the film thickness adjusting process.

According to the present disclosure in some embodiments, in forming a film on a substrate by supplying a precursor gas and a reaction gas reacting with the precursor gas on the substrate, a film-forming process is performed using a main precursor gas supply part and a reaction gas supply part. Thereafter, an adjustment-purpose precursor gas is supplied from an adjustment-purpose precursor gas supply part so as to compensate for a film thickness of a portion having a relatively thin film thickness. Accordingly, the in-plane uniformity of the film thickness of the film formed on the substrate is improved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming apparatus for forming a thin film by repeating a cycle a plurality of times, the cycle including supplying and adsorbing a precursor gas onto a substrate mounted on a rotary table inside a vacuum container while the rotary table rotates and subsequently generating a reaction product by allowing the precursor gas adsorbed onto the substrate to react with a reaction gas, the film-forming apparatus comprising:
   a main precursor gas supplier configured to supply the precursor gas;
   a reaction gas supplier configured to supply the reaction gas;
   at least one adjustment-purpose precursor gas supplier configured to supply an adjustment-purpose precursor gas to adjust an in-plane film thickness distribution of the thin film; and
   a controller configured to output a control signal so as to execute a step of forming the thin film on the substrate using the main precursor gas supplier and the reaction gas supplier, and subsequently a step of supplying the adjustment-purpose precursor gas from the at least one adjustment-purpose precursor gas supplier to compensate for a film thickness of a portion having a relatively thin film thickness as compared to other portions in the thin film,
   wherein the at least one adjustment-purpose precursor gas supplier includes:
      a central-side gas supply passage connected to a plurality of central-side gas discharge ports;
      a peripheral-side gas supply passage connected to a plurality of peripheral-side gas discharge ports; and
      a source gas supply pipe connected to the central-side gas supply passage and the peripheral-side gas supply passage,
   wherein a central-side valve and a peripheral-side valve are respectively installed in the central-side gas supply passage and the peripheral-side gas supply passage, and
   wherein the controller is configured to open and close the central-side valve and the peripheral-side valve based on a rotational angle of the rotary table, and is configured to open the central-side valve and close the peripheral-side valve while the rotary table rotates through a range of rotational angles.

2. The film-forming apparatus of claim 1, wherein the main precursor gas supplier is further configured to serve as the at least one adjustment-purpose precursor gas supplier.

3. The film-forming apparatus of claim 1, wherein the rotary table is configured to revolve along a mounting surface,
   wherein the main precursor gas supplier and the at least one adjustment-purpose precursor gas supplier are disposed apart from the reaction gas supplier in a revolution direction, and
   wherein the controller is further configured to control a flow rate adjusting device so as to obtain a flow rate distribution of the precursor gas in accordance with a position of the substrate in the revolution direction.

4. The film-forming apparatus of claim 3, wherein the at least one adjustment-purpose precursor gas supplier includes a plurality of adjustment-purpose precursor gas suppliers which are installed at positions separated from each other above the substrate in the revolution direction, and
   wherein the plurality of adjustment-purpose precursor gas suppliers have different flow rate distributions of a gas discharged onto the substrate.

5. The film-forming apparatus of claim 3, wherein the at least one adjustment-purpose precursor gas supplier includes a plurality of adjustment-purpose precursor gas suppliers which are installed at positions separated from each other above the substrate in the revolution direction, and
   wherein the plurality of adjustment-purpose precursor gas suppliers have the same flow rate distribution of a gas discharged onto the substrate.

6. The film-forming apparatus of claim 1, wherein the controller is configured to perform the step of supplying the adjustment-purpose precursor gas from the at least one adjustment-purpose precursor gas supplier based on a result of measurement of a film thickness distribution of the film corresponding to a type of the substrate.

7. The film-forming apparatus of claim 1, further comprising: a film thickness measuring device configured to measure a film thickness distribution of the thin film formed in the step of generating the thin film,
   wherein the controller is configured to execute the step of supplying the adjustment-purpose precursor gas from the at least one adjustment-purpose precursor gas supplier based on a result measured by the film thickness measuring device.

8. The film-forming apparatus of claim 1, wherein the precursor gas supplied from the main precursor gas supplier and the adjustment-purpose precursor gas supplied from the at least one adjustment-purpose precursor gas supplier are identical to each other.

9. The film-forming apparatus of claim 1, wherein the controller is configured to open and close the central-side valve and the peripheral-side valve independently such that the adjustment-purpose precursor gas is supplied independently from the plurality of central-side gas discharge ports and the plurality of peripheral-side gas discharge ports.

10. A film-forming apparatus for forming a thin film by repeating a cycle a plurality of times, the cycle including supplying and adsorbing a precursor gas onto a substrate mounted on a rotary table inside a vacuum container while the rotary table rotates and subsequently generating a reaction product by allowing the precursor gas adsorbed onto the substrate to react with a reaction gas, the film-forming apparatus comprising:
   a main precursor gas supplier configured to supply the precursor gas;
   a reaction gas supplier configured to supply the reaction gas;
   at least one adjustment-purpose precursor gas supplier configured to supply an adjustment-purpose precursor gas to adjust an in-plane film thickness distribution of the thin film; and
   a controller configured to output a control signal so as to execute a step of forming the thin film on the substrate using the main precursor gas supplier and the reaction gas supplier, and subsequently a step of supplying the adjustment-purpose precursor gas from the at least one adjustment-purpose precursor gas supplier to compensate for a film thickness of a portion having a relatively thin film thickness as compared to other portions in the thin film, wherein the at least one adjustment-purpose precursor gas supplier includes:
- a central-side gas supply passage connected to a plurality of central-side gas discharge ports;
- a peripheral-side gas supply passage connected to a plurality of peripheral-side gas discharge ports; and
- a source gas supply pipe connected to the central-side gas supply passage and the peripheral-side gas supply passage, wherein a central-side valve and a peripheral-side valve are respectively installed in the central-side gas supply passage and the peripheral-side gas supply passage, and wherein the controller is configured to open and close the central-side valve and the peripheral-side valve based on a rotational angle of the rotary table, and is configured to close the central-side valve and open the peripheral-side valve while the rotary table rotates through a range of rotational angles.

* * * * *